(12) United States Patent
Liu et al.

(10) Patent No.: US 12,004,401 B2
(45) Date of Patent: Jun. 4, 2024

(54) DISPLAY PANEL, DISPLAY PANEL MANUFACTURING METHOD, AND DISPLAY SCREEN

(71) Applicant: Yungu (Gu'an) Technology Co., Ltd., Langfang (CN)

(72) Inventors: Rusheng Liu, Kunshan (CN); Cuicui Sheng, Kunshan (CN); Lin Xu, Kunshan (CN); Genmao Huang, Kunshan (CN); Bo Yuan, Kunshan (CN); Zhe Du, Kunshan (CN); Junhui Lou, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 723 days.

(21) Appl. No.: 17/159,122

(22) Filed: Jan. 26, 2021

(65) Prior Publication Data

US 2021/0151521 A1    May 20, 2021

Related U.S. Application Data

(63) Continuation of application No. PCT/CN2019/090869, filed on Jun. 12, 2019.

(30) Foreign Application Priority Data

Dec. 29, 2018  (CN) .......................... 201811654739.9

(51) Int. Cl.
*H10K 59/35*  (2023.01)
*H10K 50/844*  (2023.01)
(Continued)

(52) U.S. Cl.
CPC ......... *H10K 59/353* (2023.02); *H10K 50/844* (2023.02); *H10K 59/122* (2023.02);
(Continued)

(58) Field of Classification Search
CPC .................................................. H10K 59/353
See application file for complete search history.

(56) References Cited

U.S. PATENT DOCUMENTS

| 2007/0210706 A1 | 9/2007 | Song |
| 2010/0026167 A1 | 2/2010 | Park et al. |
| (Continued) | | |

FOREIGN PATENT DOCUMENTS

| CN | 101930994 A | 12/2010 |
| CN | 102253527 A | 11/2011 |
| (Continued) | | |

OTHER PUBLICATIONS

Notification of grant of corresponding Chinese Application No. 201811654739.9.

(Continued)

*Primary Examiner* — Douglas M Menz
(74) *Attorney, Agent, or Firm* — KILPATRICK TOWNSEND & STOCKTON LLP

(57) ABSTRACT

A display panel, a display panel manufacturing method, and a display screen are provided. The display panel includes: a substrate, the substrate including a plurality of sub-pixel regions, each of the sub-pixel regions including a first region and a second region, the first region being provided with the substrate, a buffer layer, and a pixel circuit layer, and the second region being provided with the substrate; and a first electrode disposed on the second region of each of the sub-pixel region and directly contacting the substrate. Each sub-pixel region is divided into the first region and the second region, the first region is provided with the substrate, the buffer layer and the pixel circuit layer, the second region is provided with the substrate and the first electrode directly contacting the substrate, and no inorganic film is provided between the first electrode and the substrate.

18 Claims, 17 Drawing Sheets

(51) Int. Cl.
    *H10K 59/122*    (2023.01)
    *H10K 59/131*    (2023.01)
    *H10K 59/176*    (2023.01)
    *H10K 71/00*     (2023.01)
    *H10K 59/12*     (2023.01)
    *H10K 102/10*    (2023.01)

(52) U.S. Cl.
    CPC ......... *H10K 59/131* (2023.02); *H10K 59/176* (2023.02); *H10K 71/00* (2023.02); *H10K 59/1201* (2023.02); *H10K 2102/102* (2023.02); *H10K 2102/103* (2023.02)

(56) References Cited

U.S. PATENT DOCUMENTS

| | | | | |
|---|---|---|---|---|
| 2012/0069425 | A1* | 3/2012 | Sato | G02F 1/167 |
| | | | | 359/296 |
| 2016/0195751 | A1* | 7/2016 | Niu | G02F 1/136286 |
| | | | | 438/622 |
| 2016/0247864 | A1 | 8/2016 | Zhang | |
| 2016/0268320 | A1 | 9/2016 | Long et al. | |
| 2017/0040396 | A1 | 2/2017 | Li et al. | |
| 2020/0219967 | A1* | 7/2020 | Lou | H10K 59/65 |
| 2021/0376004 | A1 | 12/2021 | Li et al. | |

FOREIGN PATENT DOCUMENTS

| | | |
|---|---|---|
| CN | 104201292 A | 12/2014 |
| CN | 104218041 A | 12/2014 |
| CN | 104752463 A | 7/2015 |
| CN | 104867958 A | 8/2015 |
| CN | 106024835 A | 10/2016 |
| CN | 108010947 A | 5/2018 |
| CN | 108365123 A | 8/2018 |
| CN | 108428729 A | 8/2018 |
| CN | 108717244 A | 10/2018 |
| KR | 20100035455 A | 4/2010 |
| TW | 201346410 A | 11/2013 |

OTHER PUBLICATIONS

International Search Report and Written Opinion for International Application No. PCT/CN2019/090869.
First Office Action of corresponding Chinese application No. 201811654739.9 mailed Jul. 5, 2021.

* cited by examiner

DISPLAY PANEL, DISPLAY PANEL MANUFACTURING METHOD, AND DISPLAY SCREEN

CROSS REFERENCE TO RELATED APPLICATIONS

This application is a continuation to International Application No. PCT/CN2019/090869, filed on Jun. 12, 2019, which is based upon and claims priority to Chinese Patent Application No. 201811654739.9, filed on Dec. 29, 2018, the entire contents of which are incorporated herein by reference.

TECHNICAL FIELD

The present application relates to the field of display technology, specifically to a display panel.

BACKGROUND

With the rapid development of display terminals, users have increasingly high requirements for the proportion of a screen, and full-screen display has attracted ever more attention from the industry. A part of the area on the top of the screen, such as the front fringe area of the iPhone X, is usually reserved for installing camera, sensor, earpiece and other components, which affects the overall appearance of the screen.

SUMMARY

To solve the above technical problem, a display panel, a display panel manufacturing method, a display screen and a display terminal are provided.

A display panel is provided in a first aspect of the present application, comprising: a substrate comprising a plurality of sub-pixel regions, each of the sub-pixel regions comprising a first region and a second region, wherein the substrate in the first region is provided a buffer layer and a pixel circuit layer; and a first electrode disposed on the substrate in the second region of each of the sub-pixel regions and directly contacting the substrate in the second region.

A display panel manufacturing method is provide in a second aspect of the present application, comprising the following steps: providing a substrate comprising a plurality of sub-pixel regions, each of the sub-pixel regions comprising a first region and a second region, wherein both of the first region and the second region are respectively provided with the substrate; disposing a buffer layer and a pixel circuit layer on the substrate in the first region; and disposing a first electrode on the substrate in the second region, the first electrode being in direct contact with the substrate in the second region.

A display screen is provided in a third aspect of the present application, comprising at least a first display region and a second display region, each of the first display region and the second display region being used to display a dynamic or static picture, and a photosensitive device being disposed below the first display region; wherein, the first display region is provided with the display panel according to the first aspect of the present application, and the second display region is provided with a display panel selected from a PMOLED (passive matrix organic light-emitting diode) display panel or an AMOLED (active matrix organic light-emitting diode) display panel.

The technical solutions of the present application have the following advantages:

The display panel provide by the present application comprises: a substrate comprising a plurality of sub-pixel regions, each of the sub-pixel regions comprising a first region and a second region, wherein the first region is provided with the substrate, a buffer layer and a pixel circuit layer, and the second region is provided with the substrate; and a first electrode disposed on the second region of each of the sub-pixel regions and directly contacting the substrate. According to the above display panel, each sub-pixel region is divided into a first region and a second region, the first region is provided with the substrate, a buffer layer and a pixel circuit layer, and the second region is provided with the substrate and the first electrode directly contacting the substrate, and no inorganic film layer is provided between the first electrode and the substrate, so the coverage area of the inorganic film layer is reduced and the transparency of the display panel is improved.

DETAILED DESCRIPTION

In order to make the purpose, technical solutions and advantages of embodiments of the present application clearer, the technical solutions in the embodiments of the present application will be described as follows clearly and completely in conjunction with figures accompanying the embodiments of the present application, and apparently, the described embodiments are just part rather than all embodiments of the present application. Based on the embodiments of the present application, all the other embodiments acquired by those skilled in the art without delivering creative efforts shall fall into the protection scope of the present application.

In order to achieve a full-screen display, it is necessary for a display screen to achieve a certain transparency to meet the transparency requirements of cameras and the like. However, since the inorganic film layer and organic film layer comprised in a pixel circuit are made of materials with a transmittance less than 100%, the transparency of the display screen is compromised by these film layers, affecting the overall consistency of the display screen.

Based on this, the present application provides a display panel, with no inorganic film layer or organic film layer covered on non-essential areas thereof, so the coverage area of film layers such as organic film layer and inorganic film layer, etc. is reduced and the transparency of the display panel is improved, thus the above problem is well solved.

Figure 1:
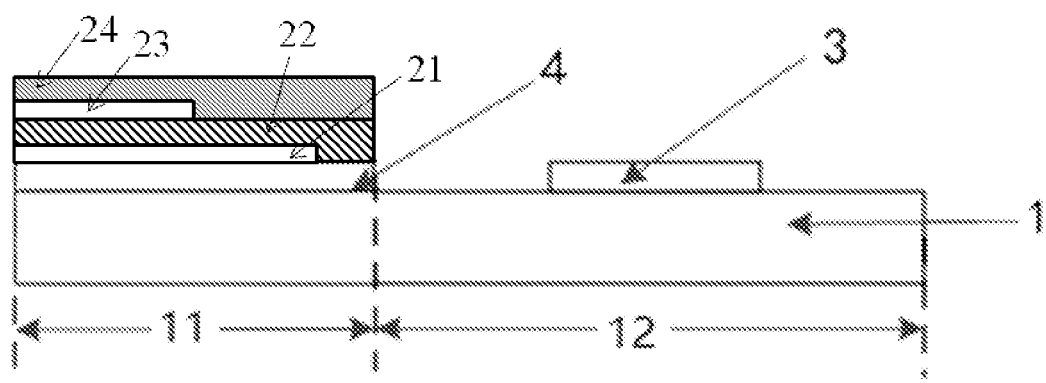
FIG. 1 is a cross-sectional view of a display panel in an embodiment of the present application.

FIG. 1 is a cross-sectional view of a display panel in an embodiment. As shown in FIG. 1, the display panel comprises: a substrate 1; a plurality of sub-pixel regions disposed on the substrate 1, each of the sub-pixel regions comprising a first region 11 and a second region 12, wherein the first region 11 is provided with a buffer layer 4 and a pixel circuit layer 2 disposed on the substrate 1, and the second region 12 is provided with a first electrode 3 which is in direct contact with the substrate 1 corresponding to the second region 12.

In an embodiment, specifically, a pixel circuit layer is provided on the first region 11 of each sub-pixel region, a first electrode 3 corresponding to the pixel circuit layer is arranged on the second region 12 of each sub-pixel region, and the first electrode 3 and the pixel circuit layer 2 have one-to-one correspondence.

In an embodiment, the substrate 1 may be an underlayer, a flexible substrate such as a PI film, etc., or a rigid substrate such as a glass substrate, a quartz substrate, a transparent substrate such as a plastics substrate, etc., to improve the transparency of the device.

In the above display panel, each sub-pixel region is divided into a first region and a second region, the first region is provided with a buffer layer and a pixel circuit layer disposed on the substrate, and the second region is provided with a first electrode directly contacting the substrate, and no inorganic film layer is provided between the first electrode and the substrate, so the coverage area of the inorganic film layer is reduced and the transparency of the display panel is improved.

Figure 2:
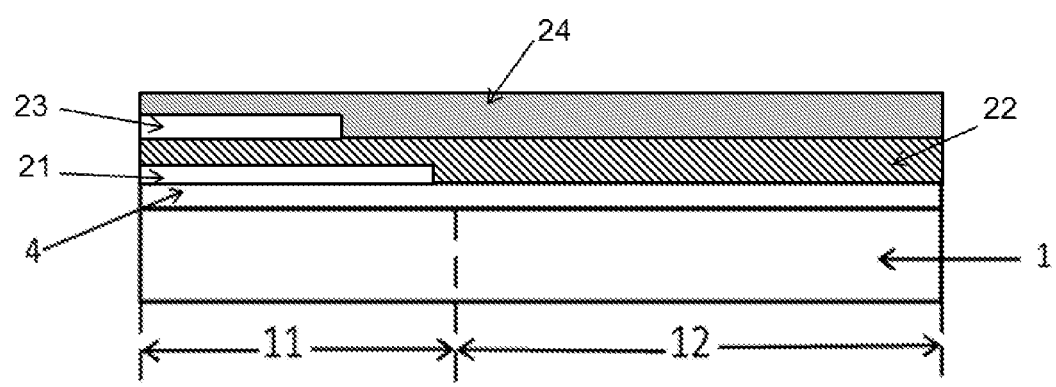
FIG. 2 is a schematic diagram of the display panel in an embodiment.

In an embodiment, as shown in FIG. 1, the pixel circuit layer 2 may comprise an active layer 21, a gate insulation layer 22, a gate layer 23, and an interlayer insulation layer 24 which are successively disposed on the substrate 1 corresponding to the first region. The gate insulation layer and the interlayer insulation layer are only disposed in the first region, and can be formed as follows: the buffer layer, the gate insulation layer and the interlayer insulation layer are prepared into film layers covering the entire surface of the substrate by a conventional process. For example, spin coating or deposition method can be adopted to prepare the buffer layer, gate insulation layer and interlayer insulation layer covering the entire surface, and these three inorganic film layers are covered on the first region and the second region, as shown in FIG. 2. Following preparation of the ILD layer (interlayer insulation layer), the inorganic film layers are patterned via a mask according to the following steps: subjecting the inorganic film layers to photoresist patterning, coating, exposure, and development, and etching the inorganic film layers (the buffer layer, the gate insulation layer GI and the interlayer insulation layer ILD) by dry etching (with CF4 as an etching gas) or dry etching+wet etching (with BOE as an etching solution) to remove the inorganic films at the position of the first electrode in the second region. Of course, in other embodiments, the inorganic film layer at the position of the first electrode in the second region can be removed upon preparation of one layer of the inorganic film layer, or the inorganic film layer can be directly formed on the region outside of the position of the first electrode. The specific implementation method can be reasonably selected according to actual situations, to which there are no restrictions herein.

Figure 3:
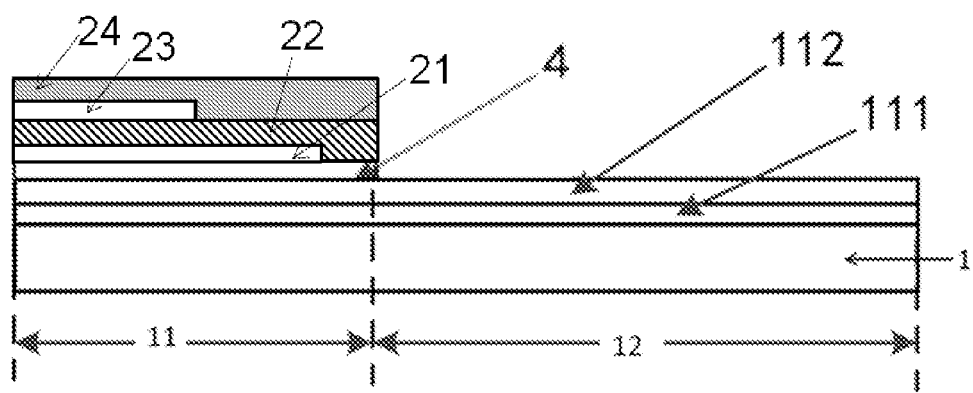
FIG. 3 is a schematic diagram of the display panel in another embodiment of the present application.

The substrate can also be provided with a barrier layer (not shown in the figure) thereon, and in this case, in order to achieve higher transparency, the barrier layer does not cover the position of the first electrode. In addition, in the existing technological process, during the formation of the substrate, two barrier layers are prepared on the substrate at the same time. The first barrier layer 111 is usually made of silicon nitride, and the second shield layer 112 is usually made of silicon oxide, as shown in FIG. 3. In this case, the above removal method in this embodiment can be used to partially remove or completely remove the two barrier layers at the position of the first electrode in the second region, to further improve the transparency of the display panel.

In an embodiment, the display panel further comprises: a lead disposed on the substrate 1 and comprising at least one of a scan line, a data line and a connection line in the pixel circuit layer; and an inorganic film layer disposed on the substrate 1 where a projection of the lead is overlapped and comprising at least one of a gate insulation layer, an interlayer insulation layer and the buffer layer.

Specifically, in this embodiment, the lead comprises a scan line, a data line and a connection line in the pixel circuit layer, and the lead can be arranged in the first region, or the second region, as practically required.

In an embodiment, the second region 12 comprises a light emitting area and a non-light emitting area, the first electrode 3 disposed on the light emitting area and the lead disposed on the non-light emitting area are in direct contact with the substrate, and/or the inorganic film layer is disposed between the substrate 1 and the lead located on the non-light emitting area. Specifically, the light emitting area is not covered by the inorganic film layer and provided with the first electrode thereon; and the non-light emitting area can be entirely, partially or not covered by the inorganic film layer.

Specifically, when the non-light emitting area is not covered by the inorganic film layers at all, the lead in the non-light emitting area directly contacts the substrate. When the non-light emitting area is entirely covered by the inorganic film layers, the inorganic film layer is arranged between the lead in the non-light emitting area and the substrate, and the inorganic film layer between the lead and the substrate is different according to the steps before and after the preparation of the lead. In the case where the lead is formed after preparation of the buffer layer and before preparation of the gate insulation layer, the inorganic film layer between the lead and the substrate is a buffer layer. And in the case where the lead is formed after preparation of the gate insulation layer and before preparation of the interlayer insulation layer, the inorganic film layer between the lead and the substrate is a buffer layer and a gate insulation layer.

In an embodiment, the non-light emitting area comprises a lead area for disposing the lead and a non-functional area, and the non-functional area is not covered by the inorganic film layer thereon. The inorganic film layer does not cover the non-functional area, and thus is removed as much as possible, so as to reduce the coverage area of the inorganic film layer and improve the transparency of the display panel.

In an embodiment, the pixel circuit layer is arranged on the first region of the substrate, and the first electrode, the scan line and the data line are arranged on the second region of the substrate. Only the first region is covered by the inorganic film layer (such as the buffer layer, the gate insulation layer CI, the interlayer insulation layer ILD) formed during the preparation of the pixel circuit. The second region is provided with the inorganic film layer merely on the substrate where the projection of the lead is overlapped. Since no organic film layer or inorganic film layer is arranged in the non-essential areas of the display panel, the coverage area of the film layers is reduced and the transparency of the display panel is improved.

In an embodiment, in order to maximize the overall transparency of the display panel, both the first electrode and the lead are made of a transparent conductive material with a transmittance greater than 90%, which results in a better transmittance for the entire display panel and a higher transparency for the display panel. Of course, in other alternative embodiments, the transmittance of the transparent conductive material can also be set to other values, such as 80% or 95%, and the specific value can be set reasonably according to actual needs.

Specifically, the transparent conductive material can be indium tin oxide (ITO), indium zinc oxide (IZO), or silver-doped indium tin oxide (Ag+ITO), or silver-doped indium zinc oxide (Ag+IZO). Since the ITO process is mature and inexpensive, the conductive material is preferably indium zinc oxide. Further, in order to reduce the resistance of each conductive trace under the premise of ensuring a high transmittance, the transparent conductive material is aluminum-doped oxidation zinc, silver-doped ITO or silver-doped IZO and the like.

In other alternative embodiments, the transparent conductive material can also be other materials depending on actual need, which is not limited in this embodiment. In an alternative embodiment, at least one of the first electrode, the data line and the scan line is made of the transparent conductive material.

In an embodiment, the lead comprises a first lead layer and a second lead layer which are stacked. The second lead layer is located above the first lead layer. The resistance of the transparent conductive material (such as the ITO) is higher than the resistance of a metal wire, and in order to achieve good electrical properties, the metal wire is usually used as the lead such as the connection line, the data line, and the scan line, but the trace of these metal wires will seriously affect the transparency of the display panel. However, a stacking arrangement of two lead layers composed of the transparent conductive material in this embodiment can significantly reduce the resistance of the transparent conductive material, thereby achieving high transparency while ensuring the electrical properties. Of course, in other alternative embodiments, any one or any two of the scan line, the data line and the connection line in the pixel circuit layer can also be arranged as a stacking structure reasonably according to actual needs.

Figure 4:
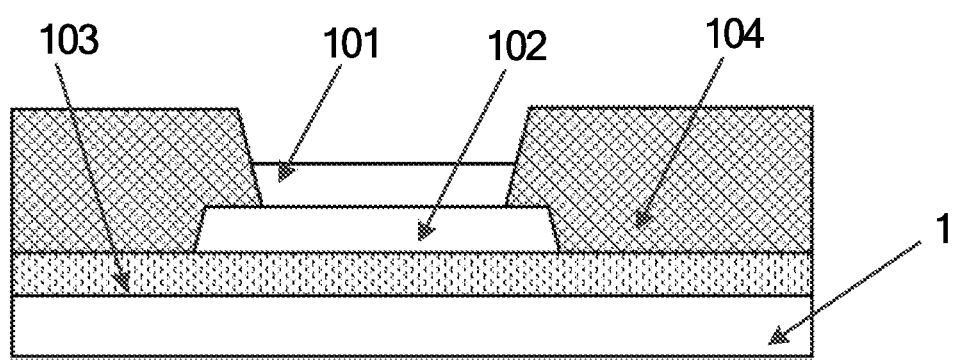
FIG. 4 is a schematic diagram of the display panel in yet another embodiment of the present application.

In this embodiment, the stacking structure comprises but is not limited to two layers. FIG. 4 is a cross-sectional view of a specific example of the stacking structure. FIG. 4 shows the substrate 1, the first lead layer 102, the second lead layer 101, the inorganic film layer 103 under the first lead layer, and the organic film layer 104 on the first lead layer. During a specific formation process, the organic film layer can also be removed using the above method for removing the inorganic film layer, except for the selection of different etching gases or etching liquids, which will not be repeated in this embodiment. Of course, in other embodiments, the stacking of more layers (such as three layers or more) also falls within the protection scope of this embodiment. For example, when the first lead layer is the data line, the first lead layer is a transparent lead layer, the inorganic film layer 103 under the first lead layer comprises GI-SixOy, BL-SixOy/SixNy, and the organic film layer 104 on the first lead layer can comprise CI-SixNy, ILD-SixOy/SixNy, flattened transparent/non-transparent organic gel.

In an embodiment, the second lead layer and the first electrode layer are formed in the same step. Specifically, the first electrode layer is an anode of an OLED (organic light-emitting diode), which is also made of a transparent conductive material. Both the data line and scan line in the first lead layer are made of an ITO material. Since no other film layer is covered on the first lead layer, when the first electrode layer is prepared in the subsequent process, an ITO layer is formed on the first lead layer, and the layer ITO is patterned to form the first electrode layer and the second lead layer covering the first lead layer. By forming the second lead layer during the preparation of the first electrode layer, process steps are saved and production costs are reduced. Of course, in other alternative embodiments, the second lead layer can also be formed in a separate step according to actual need.

On the basis of the above display panel, the display panel further comprises a flattening layer arranged on the substrate and from which the lead is exposed, so as to subsequently form stacked lead at the position where the lead is exposed, thereby reducing the resistance of the lead and improving the electrical properties.

On the basis of the above display panel, the display panel further comprises a pixel-defining layer disposed on the substrate and from which the first electrode is exposed. Specifically, the pixel-defining layer is provided with a plurality of openings from which the first electrode is exposed, which can facilitate the preparation of a light-emitting structure layer at this position in subsequent process.

On the basis of the above display panel, the display panel further comprises a light-emitting structure layer, a second electrode and an encapsulation layer which are successively stacked on the first electrode, wherein the first region comprises a pixel circuit area and a non-pixel circuit area, and the pixel circuit area and/or the light emitting area are covered by the inorganic film layer and the organic film layer.

In an embodiment, specifically, the opening of the pixel-defining layer is internally provided with a light-emitting structure layer, so as to form a plurality of sub-pixels respectively corresponding to the first electrodes; the second electrode disposed on the light-emitting structure layer and respectively corresponding to the light-emitting structure layer; and the encapsulation layer disposed on the second electrode and the pixel circuit layer. The first region comprises a pixel circuit area and a non-pixel circuit area, the pixel circuit area is covered by an inorganic film layer and an organic film layer, and the non-pixel circuit area is not covered by the inorganic film layer or the organic film layer; the second region comprises a light emitting area and a non-light emitting area, wherein the light emitting area is covered by the inorganic film layer and the organic film layer, and the non-light emitting area is not covered by the inorganic film layer or the organic film layer. The first region is divided into two parts (a pixel circuit area and a non-pixel circuit area), a pixel circuit layer is formed on the pixel circuit area, and the non-pixel circuit area is not covered by the organic film layer or the inorganic film layer. Similarly, the second region is also divided into two parts (a light emitting area and a non-light emitting area), the first electrode is formed on the light emitting area, and the non-light emitting area is not covered by the organic film layer or the inorganic film layer. Therefore, the coverage area of the organic film layer and the inorganic film layer is reduced to the maximum extent, and the transparency of the display panel is improved. The above arrangement can also reduce the absorption of light by these film layers and improve the light transmittance. Therefore when a photosensitive element (such as a camera) is arranged below the display panel, the amount of incident light and the intensity of light reaching the photosensitive element can be increased, thus enhancing the photographic effect and improving the quality of the captured image.

Figure 5:
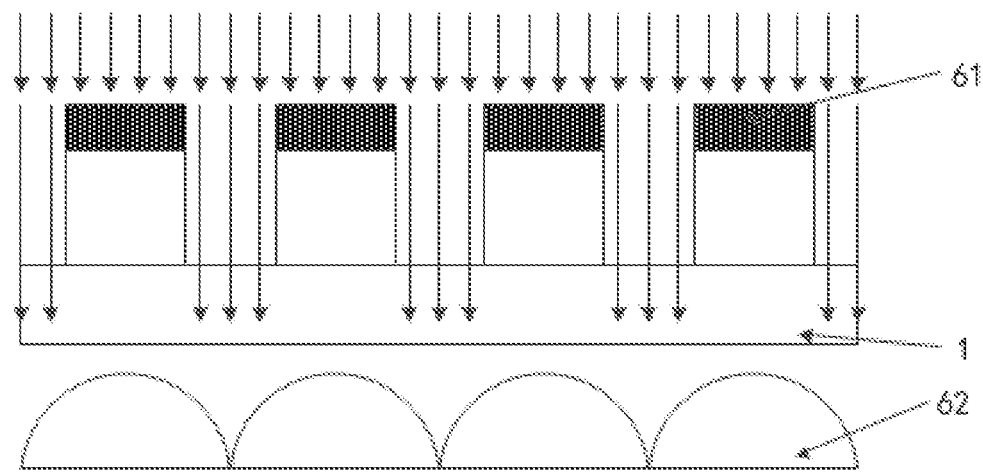
FIG. 5 is a schematic diagram of the display panel in an embodiment of the present application.
Figure 6:
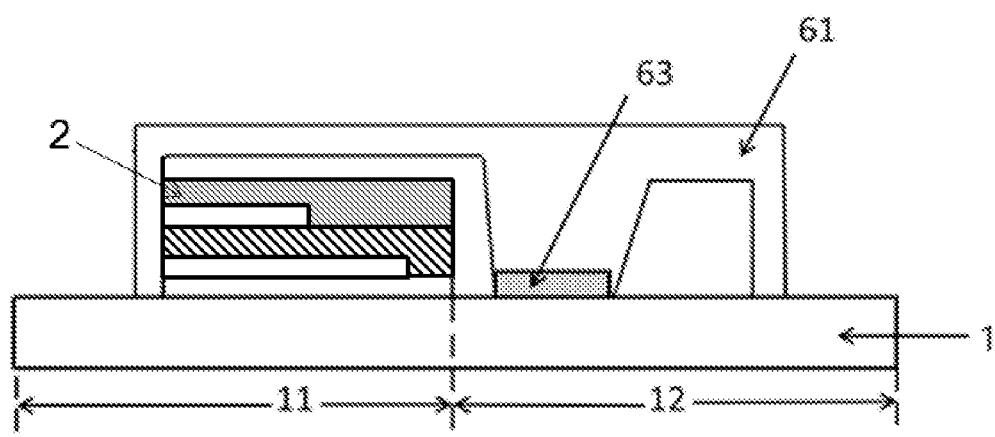
FIG. 6 is a schematic diagram of the display panel in an embodiment of the present application.

After encapsulation, the non-light emitting area and the non-pixel circuit area are patterned, and the encapsulation layer, flattening layer, silicon oxide and silicon nitride insulation layer at corresponding positions are etched, obtaining a structure as shown in FIGS. 5 and 6. FIGS. 5 and 6 show that a pixel circuit layer 2, a light-emitting structure layer 63 and an encapsulation layer 61 are provided on substrate 1, as a schematic diagram of an application scenario of the structure. A photosensitive device 62 is arranged below the substrate, the non-light-emitting area and the non-pixel circuit area on the substrate are not covered by the organic film layer or the inorganic film layer, thus the coverage area of the organic film layer and the inorganic film layer is further reduced, the transparency of the display panel is improved, and absorption of light by the film layers is reduced, which increases the intensity of light reaching the sensitive device and enhances the photographic effect.

In an embodiment, the inorganic film layer comprises an interlayer insulation layer, a gate insulation layer, a buffer layer and a flattening layer, all of which can be made of materials such as silicon oxide or silicon nitride, or a mixture thereof; of course, in other embodiments, the inorganic film layer can also comprise some of the above film layers or other film layers other than the above, which can be determined reasonably, and will not be restricted in this embodiment.

In an embodiment, the organic film layer comprises an encapsulation layer, a pixel-defining layer, and a flattening layer.

In an embodiment, the scan line is connected to a gate, and for the purpose of simplifying the process and shortening the process flow, the scan line and the gate can be formed in the same process step. In an optional embodiment, both the scan line and the gate can be made of an ITO material. In the preparation process, an ITO layer can be prepared firstly, and then patterned via a first mask to form the scan line and the gate at the same time. In an alternative embodiment, the scan line can also be arranged above or below the gate, and this requires to from the gate and the scan line separately.

In an embodiment, for the purpose of simplifying the process and shortening the process flow, the data line and the first electrode are formed in the same step. In an optional embodiment, both the data line and the first electrode are made of an ITO material. For example, ITO covering the entire surface is prepared, and then patterned via a second mask to form the data line and the first electrode at the same time. In an alternative embodiment, the data line and the first electrode can also be formed separately when they are made of different material.

In an embodiment, the scan line has two waved sides in the extension direction thereof, and the data line also has two waved sides in the extension direction thereof. The waved data line and scan line can produce diffraction fringes with different positions and diffusion directions, thereby weakening the diffraction effect, and thus ensuring that a camera placed below the display panel can capture photographs with a high definition.

Figure 7:
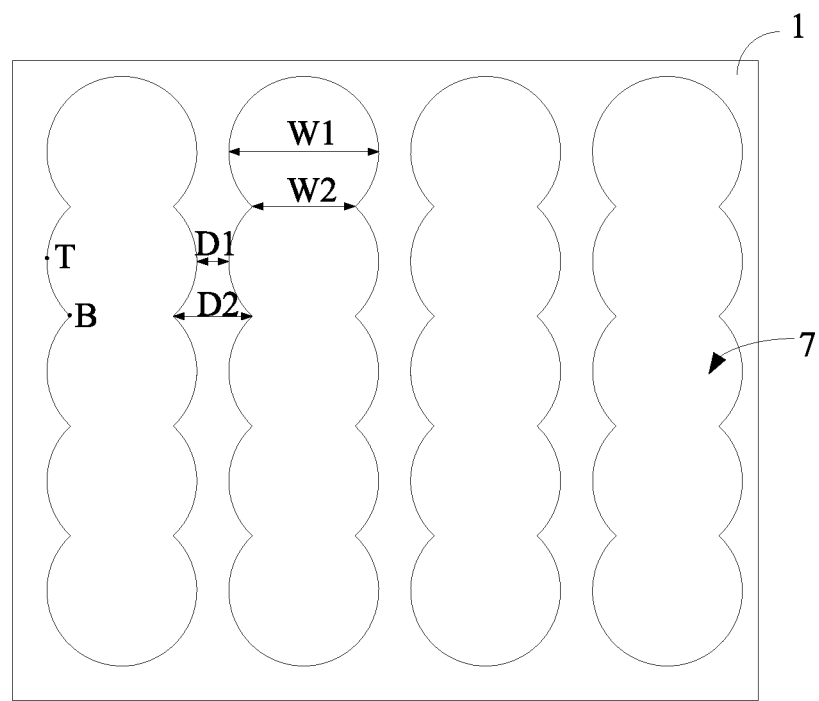
FIG. 7 is a schematic diagram a scan line of the display panel in an embodiment of the present application.

In an optional embodiment, since the scan line is waved, adjacent scan lines are spaced by a first interval which changes continuously or discontinuously; and the width of the scan line changes continuously or intermittently. Continuous change in width means the widths at any two adjacent positions of the scan line are not the same. In FIG. 7, the scan line 7 extends along the length direction. The width of the scan line changes continuously along the extension direction. The discontinuous change of the width means the widths between two adjacent positions in a portion of the scan line 7 are the same, while the widths between two adjacent positions in some other portions are different. In this embodiment, a plurality of scan lines 7 are regularly arranged on the substrate, therefore, the interval between two adjacent scan lines 7 also shows continuous changes or discontinuous changes in a direction parallel to the extension direction of scan line 7. The change of the width of the scan line 7, either continuous or discontinuous, is periodic in the extension direction.

Figure 8:
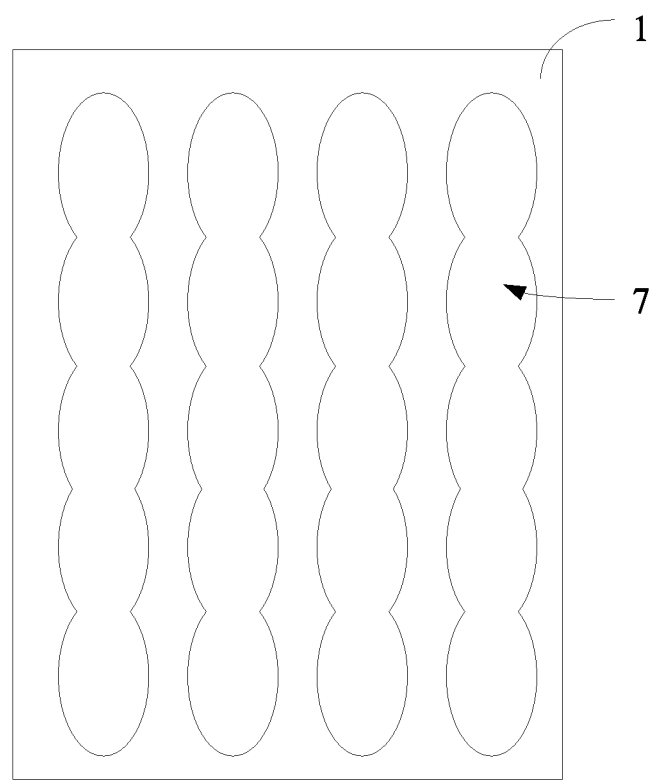
FIG. 8 is a schematic diagram of the scan line of the display panel in another embodiment of the present application.

Both sides of the scan line 7 in the extending direction are waved; the peaks of the two waved sides are arranged opposite to each other, and the valleys of the two waved sides are also arranged opposite to each other. As shown in FIG. 7, the peaks T of the two sides in the extending direction are arranged opposite to each other, and the valleys B of the two sides in the extending direction are arranged opposite to each other. The width between the peaks of the same scan line 7 is W1, the width between the valleys of the same scan line 7 is W2, and the interval between the peaks of two adjacent scan lines 7 is D1, and the interval between the valleys of two adjacent scan lines 7 is D2. In this embodiment, the two sides are formed by connecting the same arc-shaped side. In other embodiments, the two sides may also be formed by the same elliptical side connected together, as shown in FIG. 8. The arrangement of two sides of the scan line 7 in a wave shape formed by an arc or an ellipse can ensured that the diffraction fringes generated on scan line 7 can diffuse in different directions, and thus will not generate obvious diffraction effects.

Figure 9:
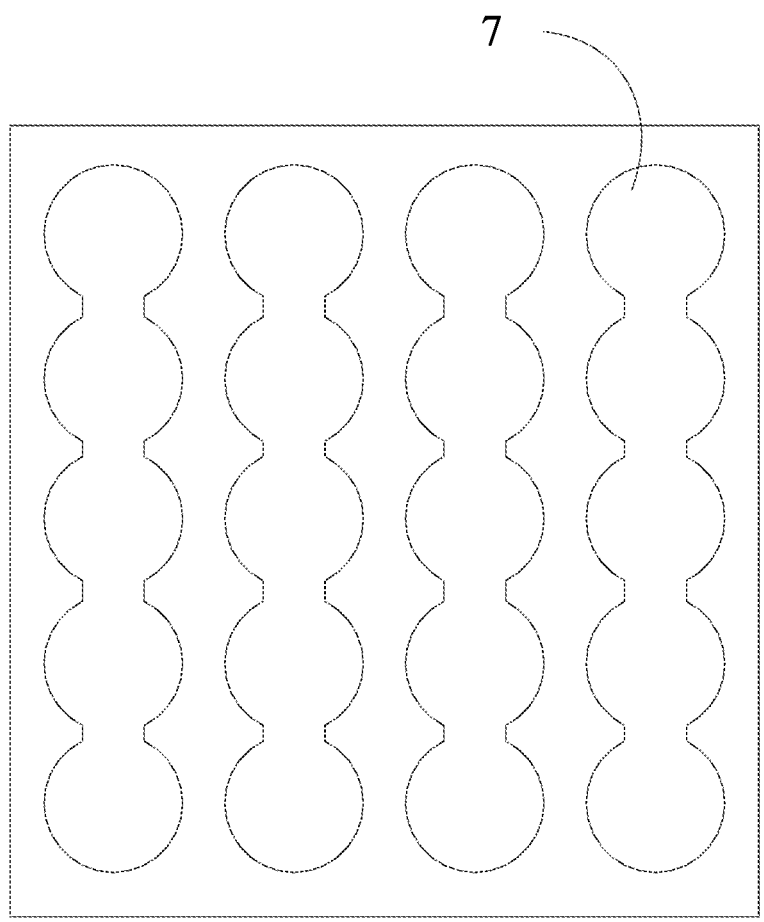
FIG. 9 is a schematic diagram of the scan line of the display panel in yet another embodiment of the present application.

In an optional embodiment, a second connection portion is formed at a position of the sides where valleys of the waved scan lines are opposite to each other. The second connection portion may be a straight line or a curved line. As shown in FIG. 9, the second connection portion has a bar shape, and the second connection portion serves as an area where the scan line 7 is electrically connected to a switching device, that is, a position where the control end of the switching device is connected to the second connection portion. In other embodiments, the second connection portion can also adopt other irregular structures, such as a shape large at two ends and small in the middle, or a shape small at two ends and large in the middle.

In an embodiment, since the data lines are waved in shape, a second interval is present between adjacent data lines, and the second interval changes continuously or discontinuously; and the width of the data lines changes continuously or discontinuously. The data line is similar to the scan line as described in detail, and will not be repeated here. The data line can adopt any of the waved shapes in FIGS. 7-9. Both sides of the data line in the extending direction are waved in shape, the peaks of the two sides are arranged opposite to each other, and the valleys of the two sides are arranged opposite to each other. A third connection portion is formed at a position where valleys of the data lines are opposite to each other, and serves as an area where the data line is electrically connected to a switching device. The arrangement of the data line is similar to and can refer to the arrangement of the scan line for details.

In an embodiment, the scan line and data line on the display panel adopt any of the waved shapes in FIGS. 7-9, which can ensure that in the extension direction of the routing of the data line and scan line, light passing through the positions with different widths and different intervals of adjacent lines can form diffraction stripes with different positions, thereby reducing the diffraction effect, so that a photosensitive device placed under the display panel can work normally.

Figure 10:
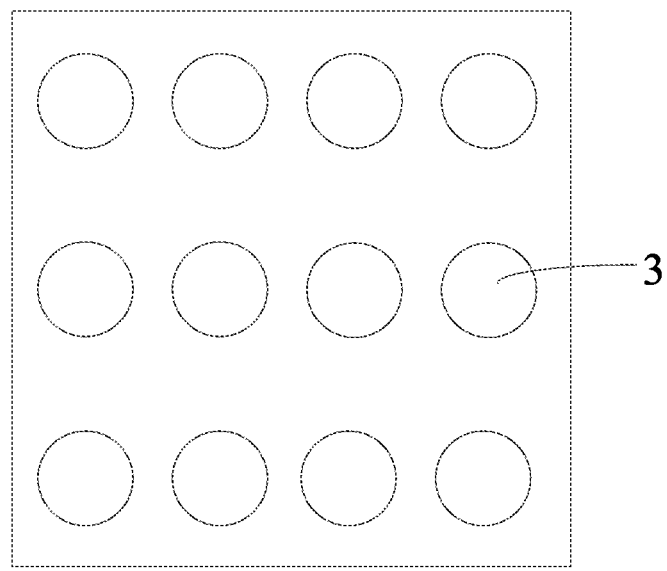
FIG. 10 is a schematic diagram of a first electrode of the display panel in an embodiment of the present application.
Figure 11:
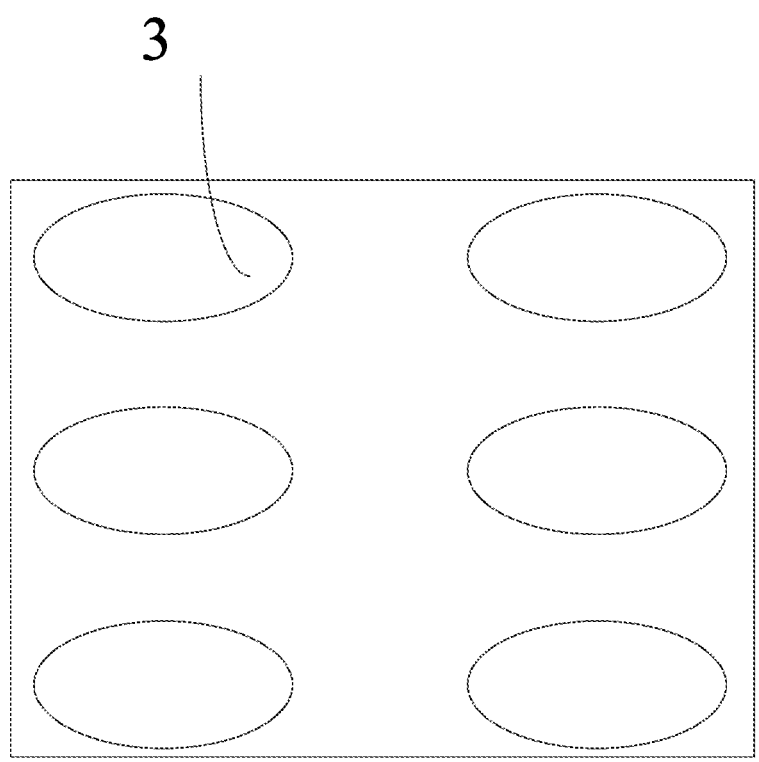
FIG. 11 is a schematic diagram of the first electrode of the display panel in an embodiment of the present application.
Figure 12:
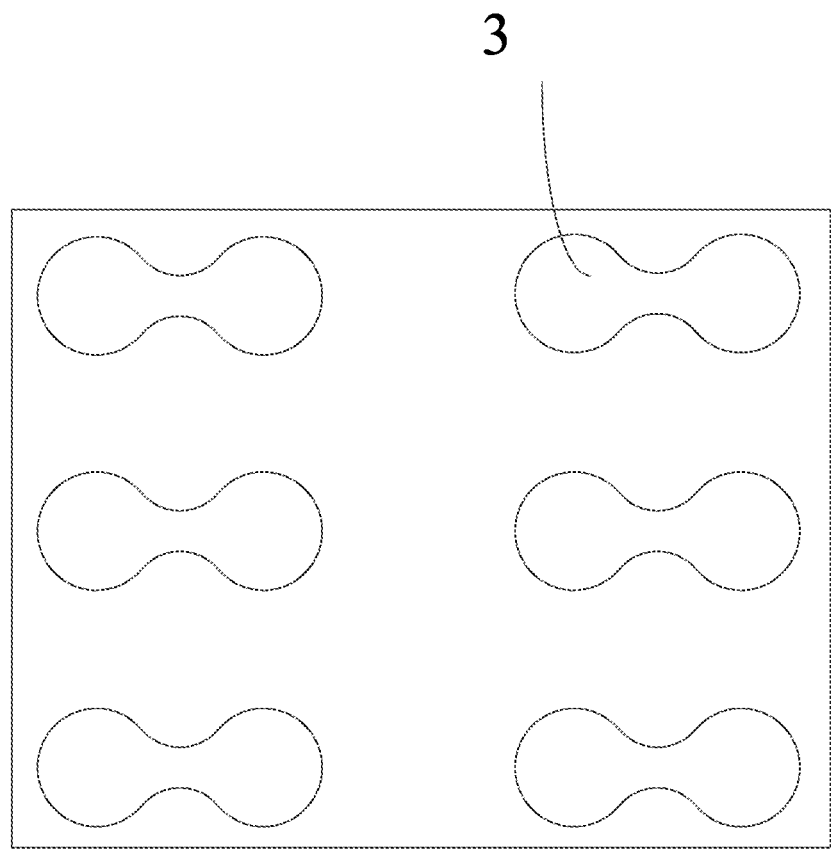
FIG. 12 is a schematic diagram of the first electrode of the display panel in yet another embodiment of the present application.

In an embodiment, the first electrode may be circle in shape as shown in FIG. 10, or ellipse in shape as shown in FIG. 11, or dumbbell in shape as shown in FIG. 12, and the first electrode may have a shape composed of curves with different curvature radius. Diffraction refers to a phenomenon that when light passes through obstacles such as slits, small holes, or discs, it will be bent to different degrees during propagation, thus deviating from the original straight line. In the process of diffraction, the distribution of diffraction fringes will be affected by the size of obstacles, such as the width of the slits, the size of the small holes, etc., and obvious diffraction effect will appear when diffraction fringes generated at the positions with the same width are consistent in positions. By changing the shape of the anode to a circle, ellipse or dumbbell, it can be ensured that when light passes through the anode layer, diffraction stripes with different positions and diffusion directions can be generated at different width positions of the anode, thereby weakening the diffraction effect and thereby ensuring that a camera placed below the display panel can capture pictures with a high definition.

A projection of the opening of the pixel-defining layer on the substrate has curvy sides which are not parallel to each other, that is, the opening has varying widths in all directions and different directions of diffraction and diffusion at the same position. When external lights passes through the opening, diffraction stripes with different positions and diffusion directions can be generated at positions of different width, which will not produce obvious diffraction effects, thereby ensuring that a photosensitive element arranged below the display panel can work normally.

Traditional openings of the pixel-defining layer are arranged to have a rectangular or a square shape according to the pixel size. Taking a rectangular opening as an example, the opening has the same width in both the length and width directions because the rectangle has two sets of parallel sides. Therefore, when external light passes through the opening, the diffraction fringes with the same position and the same diffusion direction are generated at different positions in the length direction or the width direction, so that a significant diffraction effect occurs, disallowing a photosensitive element placed below the display panel to work normally. The display panel in this embodiment can solve this problem well, and ensure that the photosensitive element under the display panel can work normally.

In an embodiment, the opening has a projection on the substrate, and each side of the projection may be shaped in circle, ellipse or any other curve with varying curvatures. Since each side of the opening is curved in shape, when the light passes through the opening, the resulted diffraction fringes diffuse in directions of 360 degrees rather than in one direction, which makes the diffraction extremely insignificant and has a better diffraction improvement effect.

In an embodiment, the opening has a circular, elliptical, dumbbell-shaped or wavy projection on the substrate, similar to the shape of the first electrode, so details are not repeated herein, and one can refer to the first electrode and FIGS. 10-12. The projection shape of the opening on the substrate can be determined according to the shape of the corresponding light-emitting structure. For example, the number can be determined according to the aspect ratio of the light-emitting structure. In an embodiment, the projection shape of the opening on the substrate can also be an axisymmetric structure, so as to ensure pixels on the entire display panel has a consistent aperture rate, not affecting the final display effect. Referring to FIG. 8, when the opening has a circle shaped projection on the substrate, the corresponding light-emitting structure has a rectangular or square shape with an aspect ratio of less than 1.5, and the symmetry axis of the opening projection corresponds to the symmetry axis of the corresponding light-emitting structure. The diameter of the projection circle is smaller than the minimum width of the light-emitting structure. Specifically, the diameter of the projection circle can be determined according to the shape of the light-emitting structure in combination with the aperture rate. The determination process can be carried out using traditional methods for determining the size of the opening, and will not be repeated here.

When the aspect ratio of the light-emitting structure corresponding to the opening is between 1.5 and 2.5, the projection has a dumbbell shape formed by two circles connected to each other. Two circles are respectively arranged along the length direction of the corresponding light-emitting structure. In an embodiment, there is a connecting portion between the two circles, and both sides of the connecting portion are curved, ensuring that when light passes through the connecting portion, the light can also be diffused in all directions, thereby improving the diffraction effect.

When the aspect ratio of the light-emitting structure corresponding to the opening is greater than 2.5, the projection has a wavy shape formed by three or more circles connected to each other. The three or more circles are respectively arranged along the length direction of the corresponding light-emitting structure. In an embodiment, the projection has a connecting portion which is an arc, that is, the intersection of the more than three circles is connected by an arc, so as to ensure that when light passes through the connecting portion, light can also be diffused in all directions, thereby improving the diffraction effect.

Figure 13:
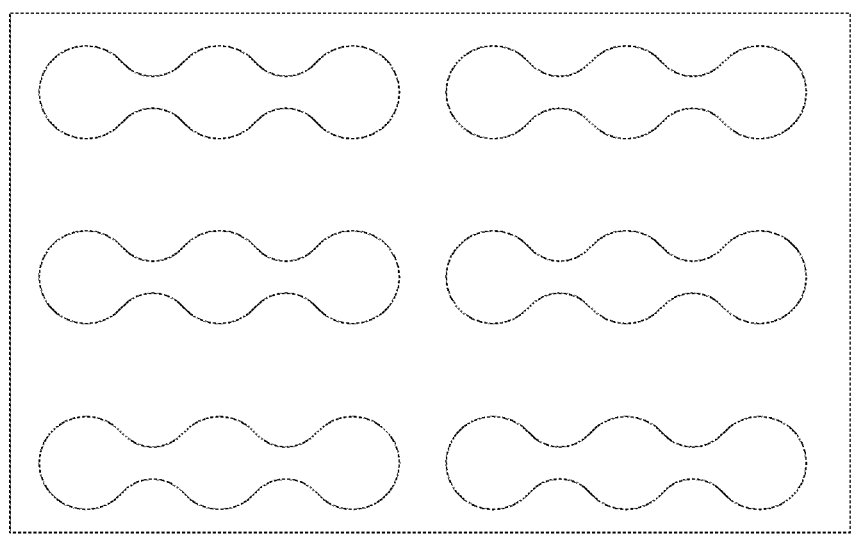
FIG. 13 is a schematic diagram of an opening in a pixel-defining layer of the display panel in an embodiment of the present application.

When the aspect ratio of the light-emitting structure corresponding to the opening is equal to 1.5, the projection can have a circular or a dumbbell shape with two circles connected to each other. When the aspect ratio of the light-emitting structure corresponding to the opening is equal to 2.5, the projection can have a dumbbell shape with two circles connected to each other, or a wave shape with three circles connected to each other, as shown in FIG. 13.

In an optional embodiment, by referring to FIGS. 10-12, the shape of the sub-pixel is the same as the shape of the above opening, that is, the sub-pixel is circle, ellipse or dumbbell in shape. Further, the shape of the anode can be designed following rules referred to those of the opening, which can further improve the diffraction effect. Of course, the anode can also be designed with a conventional rectangular shape.

Figure 14:
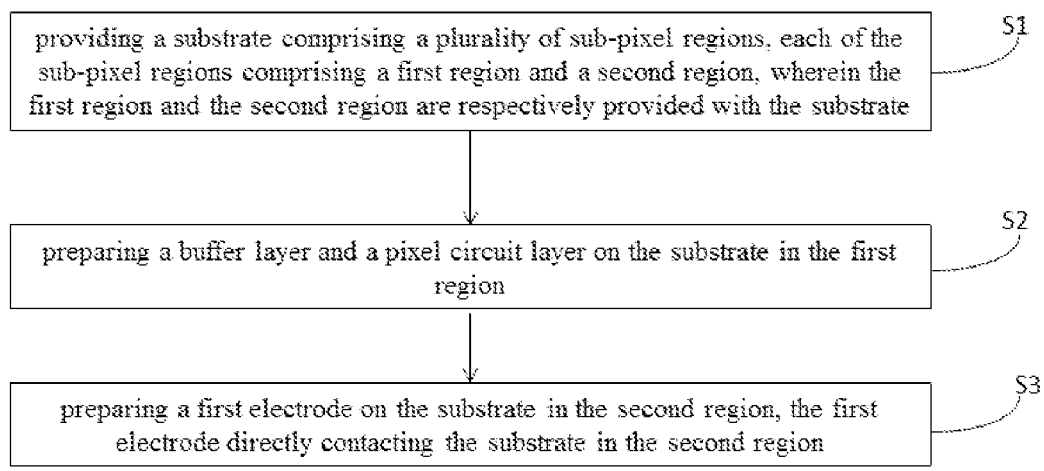
FIG. 14 is a flowchart of a display panel manufacturing method in an embodiment of the present application.

This embodiment further provides a display panel manufacturing method. By referring to FIG. 14, the display panel manufacturing method comprises the following steps S1-S3:

Step S1: disposing a substrate and a plurality of sub-pixel regions on the substrate, each of the sub-pixel regions comprising a first region and a second region, and both of the first region and the second region respectively correspond to the substrate.

In this embodiment, the substrate 1 can be a flexible substrate, such as a PI film, etc., or a rigid substrate, such as a glass substrate, a quartz substrate, or a plastic substrate and other transparent substrate, so as to improve the transparency of the device.

Step S2: disposing a buffer layer and a pixel circuit layer on the substrate correspond to the first region.

In an embodiment, specifically, a first insulation material can be formed on the entire substrate by chemical vapor deposition, and patterned to form the buffer layer which covers the substrate in the first region. And the pixel circuit layer is prepared on the buffer layer.

Step S3: disposing a first electrode on the substrate correspond to the second region, the first electrode directly contacting the substrate correspond to the second region.

According to this method, each sub-pixel region is divided into a first region and a second region, the first region is provided with a buffer layer and a pixel circuit layer, and the second region is provided with a first electrode directly contacting the substrate. No inorganic film layer is provided between the first electrode and the substrate, so the coverage area of the inorganic film layer is reduced and the transparency of the display panel is improved.

In an embodiment, the method further comprises: disposing a lead on the substrate, and disposing an inorganic film layer on the substrate where a projection of the lead is overlapped as an insulation layer among leads, wherein the inorganic film layer comprises at least one of a gate insulation layer, an interlayer insulation layer and a buffer layer, and the lead comprises at least one of a scan line, a data line and a connection line in the pixel circuit layer, so that the coverage area of the inorganic film layer is reduced, and the display effect is improved.

In this embodiment, only the data line and the scan line are taken as an example for description. Specifically, the data line is prepared on the substrate, followed by preparation of an inorganic film layer covering the entire substrate, then the scan line is prepared on the inorganic film layer, and finally, the inorganic film layer covering the entire substrate is removed, and only the inorganic film layer on the substrate where projections of the data line and the scan line are overlapped is retained. This embodiment is used for illustrative purposes only, but not to limit the embodiment. The inorganic film layer can be removed or retained according to actual needs.

In an embodiment, the second region comprises a light emitting area and a non-light emitting area, and the Step S2 of disposing the buffer layer and the pixel circuit layer on the substrate in the first region comprises the following Steps S21-S6:

S21: on the substrate, covering a first insulation material over the first region and the second region of the substrate. Specifically, the buffer layer is made of the first insulation material, and the first insulation material covering the entire substrate is prepared on the substrate, for example, via chemical vapor deposition, or via other methods, which will not be restricted in this embodiment. In this embodiment, the first insulation material may be but not limited to an inorganic insulation material such as silicon oxide or silicon nitride.

S22: disposing an active layer on the first insulation material. Specifically, the active material (such as polycrystalline silicon and single crystal silicon) can be prepared by plasma enhanced chemical vapor deposition (PECVD) process, and covers the entire substrate. Of course, in other embodiments, other methods can also be used to form the active material, which is not limited by this embodiment. Thereafter, the active material is patterned to form the active layer.

S23: on the active layer, covering a second insulation material over the first region and the second region of the substrate. Specifically, a gate insulation layer is made of the second insulation material. Chemical vapor deposition can be adopted to prepare the second insulation material covering the entire substrate. Of course, other methods can also be used to form the second insulation material, which is not limited by this embodiment. Specifically, the second insulation material can be inorganic insulation materials such as silicon oxide or silicon nitride; in other alternative embodiments, the second insulation material can also be other inorganic insulation materials, which is not limited by this embodiment.

S24: disposing a gate layer on the second insulation material. Specifically, sputtering method can be adopted to prepare, on the second insulation material, the second conductive material covering the entire substrate, and then the second conductive material is patterned to form the gate layer. Of course, other methods can also be used to form the gate layer, which is not limited by this embodiment.

In the embodiment, the second conductive material can be a metal material or a transparent conductive material, such as ITO or IZO; of course, in other embodiments, other conductive materials can also be used, which can be reasonably selected according to needs.

S25: on the gate layer, covering a third insulation material over the first region and the second region of the substrate. Specifically, the interlayer insulation layer is made of the third insulation material which covers the entire substrate and is formed on the gate layer. The third insulation material covering the entire substrate can be prepared via chemical vapor deposition. Of course, other methods can also be used to form the third insulation material, which is not limited by this embodiment. The third insulation material can be an inorganic insulation material such as silicon oxide or silicon nitride; of course, in other alternative embodiments, the third insulation material may also be other inorganic insulation materials, which is not limited by this embodiment.

S26: removing the first insulation material, the second insulation material and the third insulation material in the light emitting area via a first mask. Specifically, the first insulation material, the second insulation material and the third insulation material in the light emitting area are removed via the first mask, to expose the substrate in the light emitting area, so that the light emitting area is not covered by the buffer layer, the gate insulation layer and the interlayer insulation layer, and so that in subsequent process the first electrode is prepared in the light emitting area.

Specifically, the first mask can be an ILD mask. No new mask is required. It just needs to add patterns on an existing ILD mask, to remove the first insulation material, the second insulation material and the third insulation material from the light emitting area. No additional steps are required, so the production cost is low.

In an embodiment, the method further comprises: removing the first insulation material, the second insulation material and the third insulation material in the non-light emitting area via the first mask, so that the non-light emitting area is not covered by the inorganic film layer either, thereby further reducing the coverage of the inorganic film layer, improving the transparency of the display panel, and obtaining a better overall consistency of the screen.

In the embodiment, the non-light emitting area comprises a lead area for disposing the lead and a non-functional area. The method further comprises: removing the first insulation material, the second insulation material and the third insulation material on the non-functional area via the first mask, so that the non-functional area is not covered by the inorganic film layer, and only the lead area is covered by the inorganic film layer, thereby further reducing the coverage area of the inorganic film layer, improving the transparency of the display panel and obtaining better overall consistency of the screen.

In an embodiment, the Step S2 of disposing the buffer layer and the pixel circuit layer on the substrate in the first region further comprises the following Steps S27-S29:

Step S27: disposing a first lead layer on the substrate. Specifically, the first lead layer may be made of a transparent conductive material, such as ITO.

Step S28: forming a flattening material on the substrate. Specifically, the flattening material can be materials commonly used in the art to prepare the flattening layer.

Step S29: removing the flattening material on the first lead layer via a second mask to expose the first lead layer. Specifically, the second mask can be a PLA mask. No new mask is required. It just needs to add patterns on an existing PLA mask, to remove the flattening layer above the first lead layer, so that the first lead layer is exposed, thereby facilitating formation of a second lead layer on the first lead layer in subsequent process. No additional steps are required, so the production cost is reduced.

In an embodiment, the Step S3 of disposing a first electrode on the substrate in the second region comprises the following Steps S31-S32:

Step S31: on the substrate, covering a first conductive material over the first region and the second region. Specifically, sputtering method can be adopted to prepare the first conductive material on the substrate, and the first conductive material covers the entire substrate. Of course, other methods can also be used to form the first conductive material covering the entire substrate, which is not limited by this embodiment.

In the embodiment, the first conductive material can be a transparent conductive material, such as ITO; of course, in other embodiments, it can also be other conductive material selected reasonably according to needs.

Step S32: patterning the first conductive material to form the first electrode and to form a second lead layer covering the first lead layer. The first electrode and the second lead layer can be formed simultaneously through a single mask, thereby simplifying the preparation process, shortening the process flow, and reducing the production cost.

In an embodiment, after disposing a first electrode on the substrate in the second region in Step S3, the method further comprises the following Steps S5-S6:

Step S5: disposing, on the substrate, a pixel-defining layer from which the first electrode is exposed. Specifically, the pixel-defining layer is provided with a plurality of openings from which the first electrode is exposed.

Step S6: disposing a light-emitting structure layer, a second electrode and an encapsulation layer which are successively stacked on the first electrode. In an embodiment, specifically, the light-emitting structure layer can be formed on the first electrode exposed from the opening by evaporation, followed by preparation of a second electrode on the light-emitting structure layer, and then an encapsulation layer can be prepared.

In an embodiment, the first region comprises a pixel circuit area and a non-pixel circuit area. The method further comprises: patterning the encapsulation layer, and removing the inorganic film layer and organic film layer on the non-pixel circuit area and/or non-light emitting area.

Specifically, the inorganic and organic film layers on the non-pixel circuit area and the inorganic and organic film layers on the non-light emitting area can be removed by patterning at the same time, so that the inorganic film layer and organic film layer only cover the essential areas on the substrate, thereby increasing the transparency of the display panel, reducing light absorption by these film layers, increasing the intensity of light reaching a photosensitive element placed below the display panel, and enhancing the photographic effect.

This embodiment also provides a display screen, at least comprising a first display region and a second display region. Each display region is used to display a dynamic or a static picture, and a photosensitive device can be arranged below the first display region. Wherein, the first display region is provided with a display panel as described in any one of the above embodiments. The display panel arranged in the second display region is a PMOLED display panel or an AMOLED display panel. Since the display panel as described in the aforementioned embodiments is used in the first display region, the first display region has a high transparency and the overall display screen has a good consistency.

Figure 15:
FIG. 15 is a schematic diagram of a display screen in an embodiment of the present application.

In an embodiment, as shown in FIG. 15, the display screen comprises a first display region 161 and a second display region 162, which are both used to display static or dynamic pictures, wherein, the first display region 161 is provided with the display panel as mentioned in any one of the above embodiments, and is located on the upper part of the display screen.

In an alternative embodiment, the display screen can also comprise three or even more display regions, such as three display regions (a first display region, a second display region and a third display region), wherein the first display region is provided with the display panel as mentioned in any one of the above embodiments. There are no limitations on the display panel used in the second display region and the third display region. For example, the display panel used in the second display region and the third display region can be but not limited to a PMOLED display panel, an AMOLED display panel, and of course, can also be the display panel in this embodiment.

This embodiment also provides a display terminal, comprising the above-mentioned display screen covered on the body of a device. The above-mentioned display terminal may be a mobile phone, a tablet, a TV, a display, a palmtop computer, an ipod, a digital camera, a navigator and other products or components with a display function.

Figure 16:
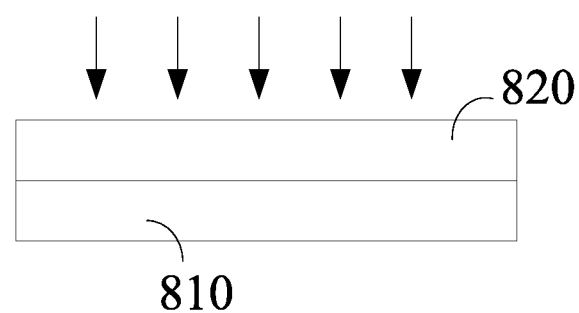
FIG. 16 is a schematic diagram of a display terminal in an embodiment of the present application.

FIG. 16 is a schematic diagram of the structure of a display terminal in an embodiment. The display terminal comprises a device body 810 and a display screen 820. The display screen 820 is provided on the device body 810 and is connected to the device body 810. The display screen 820 may be the display screen as described in any one of the aforementioned embodiments to display static or dynamic images.

Figure 17:
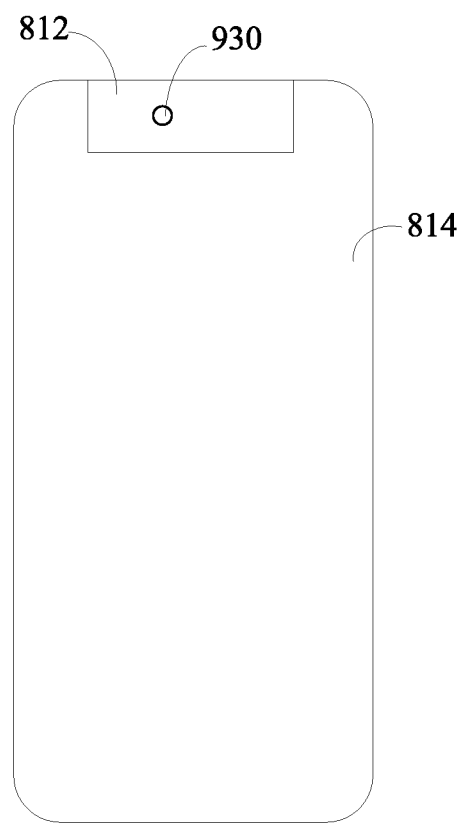
FIG. 17 is a schematic structural diagram of a device body in an embodiment of the present application.

FIG. 17 is a schematic diagram of the structure of the device body 810 in an embodiment. In this embodiment, the device body 810 may be provided with a slotted area 812 and a non-slotted area 814. The slotted area 812 may be provided with a photosensitive device such as a camera 930 and a light sensor, a light beam sensor or the like. The display panel of the first display region of the display screen 820 is attached to the slotted area 812 correspondingly, so that the above mentioned photosensitive device such as the camera 930 and the light sensor can collect external light passing through the first display region. Since the display panel in the first display region has higher transparency, the overall consistency of the screen is improved; and at the same time, the above mentioned display panel can also effectively improve the diffraction phenomenon caused by the external light transmitting through the first display region, so quality of images captured by the camera 930 on the display terminal can be effectively improved, distortion of the captured image due to diffraction can be avoided, and accuracy and sensitivity of the light sensor to external light are improved.

Although the embodiments of the present application are described in conjunction with the drawings, those skilled in the art can make various modifications and variations without departing from the spirit and scope of the present application. Such modifications and variations fall within the scope defined by the attached claims

What is claimed is:

1. A display panel, comprising:
   a substrate;
   a plurality of sub-pixel regions disposed on the substrate, each of the sub-pixel regions comprising a first region and a second region, wherein the first region is provided with a buffer layer and a pixel circuit layer disposed on the substrate;
   a first electrode, disposed on the substrate corresponding to the second region of each of the sub-pixel regions and directly contacting the substrate corresponding to the second region, wherein the second region comprises a light emitting area and a non-light emitting area, the first electrode is disposed on the light emitting area;
   a lead, disposed on the substrate and comprising at least one of a scan line, a data line and a connection line disposed in the pixel circuit layer; and
   an inorganic film layer, disposed on the substrate where a projection of the lead is overlapped and comprising at least one of a gate insulation layer, an interlayer insulation layer and the buffer layer.

2. The display panel of claim 1, wherein the lead is disposed on the non-light emitting area and is in direct contact with the substrate, and/or the inorganic film layer is disposed between the substrate and the lead located on the non-light emitting area.

3. The display panel of claim 2, wherein the non-light emitting area comprises a lead area for disposing the lead and a non-functional area, and wherein the non-functional area is not covered by the inorganic film layer thereon.

4. The display panel of claim 1, further comprising:
   a flattening layer, arranged on the substrate and from which the lead is exposed.

5. The display panel of claim 1, wherein the lead comprises a first lead layer and a second lead layer which are stacked.

6. The display panel of claim 5, wherein the lead is made of a transparent conductive material, and the transparent conductive material has a transmittance of 90% or more, and
   wherein the transparent conductive material includes indium tin oxide, indium zinc oxide, silver-doped indium tin oxide or silver-doped indium zinc oxide.

7. The display panel of claim 1, further comprising:
   a pixel-defining layer, disposed on the substrate and from which the first electrode is exposed.

8. The display panel of claim 7, further comprising:
   a light-emitting structure layer, a second electrode and an encapsulation layer which are successively stacked on the first electrode; and
   wherein the first region comprises a pixel circuit area and a non-pixel circuit area, and the pixel circuit area and/or a light emitting area are covered by the inorganic film layer and an organic film layer.

9. A manufacturing method of a display panel according to claim 1, comprising following steps:
   providing a substrate comprising a plurality of sub-pixel regions, each of the sub-pixel regions comprising a first region and a second region, both of the first region and the second region respectively correspond to the substrate;
   disposing a buffer layer and a pixel circuit layer on the substrate corresponding to the first region;
   disposing a first electrode on the substrate corresponding to the second region, the first electrode directly contacting the substrate corresponding to the second region;
   disposing a lead on the substrate, and disposing an inorganic film layer on the substrate where a projection of the lead is overlapped as an insulation layer among the lead, wherein the inorganic film layer comprises at least one of a gate insulation layer, an interlayer insulation layer and a buffer layer, and the lead comprises at least one of a scan line, a data line and a connection line in the pixel circuit layer.

10. The display panel manufacturing method of claim 9, wherein the second region comprises a light emitting area and a non-light emitting area, and wherein said disposing a buffer layer and a pixel circuit layer on the substrate in the first region comprises:
   disposing on the substrate, covering a first insulation material over the first region and the second region of the substrate;
   disposing an active layer on the first insulation material;
   disposing on the active layer, covering a second insulation material over the first region and the second region of the substrate;
   disposing a gate layer on the second insulation material;
   disposing on the gate layer, covering a third insulation material over the first region and the second region of the substrate; and
   removing the first insulation material, the second insulation material and the third insulation material in the light emitting area via a first mask.

11. The display panel manufacturing method of claim 10, wherein the method further comprises: removing the first insulation material, the second insulation material and the third insulation material in the non-light emitting area via the first mask.

12. The display panel manufacturing method of claim 10, wherein the non-light emitting area comprises a lead area for disposing the lead and a non-functional area, and the method further comprises: removing the first insulation material, the second insulation material and the third insulation material in the non-functional area via the first mask.

13. The display panel manufacturing method of claim 9, wherein, said disposing providing a buffer layer and a pixel circuit layer on the substrate in the first region further comprises:
   disposing a first lead layer on the substrate;
   forming a flattening material on the substrate; and
   removing the flattening material on the first lead layer via a second mask to expose the first lead layer.

14. The display panel manufacturing method of claim 13, wherein, said disposing a first electrode on the substrate in the second region comprises:
   disposing on the substrate, covering a first conductive material over the first region and the second region; and
   patterning the first conductive material to form the first electrode and a second lead layer covering the first lead layer.

15. The display panel manufacturing method of claim 9, wherein after disposing a first electrode on the substrate in the second region, the method further comprises:
   disposing, on the substrate, a pixel-defining layer from which the first electrode is exposed.

16. The display panel manufacturing method of claim 15, after the step of disposing, on the substrate, a pixel-defining layer, the method further comprising:
   disposing a light-emitting structure layer, a second electrode and an encapsulation layer which are successively stacked on the first electrode.

17. The display panel manufacturing method of claim 16, wherein the first region comprises a pixel circuit area and a non-pixel circuit area, and the method further comprises:
   patterning the encapsulation layer, and removing an inorganic film layer and an organic film layer on the non-pixel circuit area and/or a non-light emitting area.

18. A display screen, comprising:
   at least a first display region and a second display region, each of the first display region and the second display region being used to display a dynamic or static picture, and a photosensitive device being disposed below the first display region; and
   wherein, the first display region is provided with the display panel as defined in claim 1, and the second display region is provided with a PMOLED display panel or an AMOLED display panel.

\* \* \* \* \*